United States Patent
Ju et al.

(10) Patent No.: US 9,012,920 B2
(45) Date of Patent: Apr. 21, 2015

(54) WAFER LEVEL PACKAGED GAN POWER SEMICONDUCTOR DEVICE AND THE MANUFACTURING METHOD THEREOF

(71) Applicant: Electronics and Telecommunications Research Institute, Daejeon (KR)

(72) Inventors: Chull Won Ju, Daejeon (KR); Hae Cheon Kim, Daejeon (KR); Hyung Sup Yoon, Daejeon (KR); Woo Jin Chang, Daejeon (KR); Sang-Heung Lee, Daejeon (KR); Dong-Young Kim, Daejeon (KR); Jong-Won Lim, Daejeon (KR); Dong Min Kang, Daejeon (KR); Ho Kyun Ahn, Daejeon (KR); Jong Min Lee, Daejeon (KR); Eun Soo Nam, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/867,328

(22) Filed: Apr. 22, 2013

(65) Prior Publication Data
US 2013/0292689 A1 Nov. 7, 2013

(30) Foreign Application Priority Data
May 4, 2012 (KR) .................. 10-2012-0047360

(51) Int. Cl.
*H01L 29/20* (2006.01)
*H01L 29/66* (2006.01)
(Continued)

(52) U.S. Cl.
CPC ...... *H01L 29/2003* (2013.01); *H01L 29/66431* (2013.01); *H01L 29/41758* (2013.01);
(Continued)

(58) Field of Classification Search
CPC ............ H01L 29/66462; H01L 29/2003; H01L 29/66431; H01L 29/7786; H01L 29/7787; H01L 29/66446; H01L 29/41758; H01L 29/66522
USPC .................. 257/713, 778, E21.403, E29.246
See application file for complete search history.

(56) References Cited

U.S. PATENT DOCUMENTS 6,825,559 B2    11/2004  Mishra et al.
7,235,439 B2 *  6/2007   Udrea et al. .................. 438/212
(Continued)

FOREIGN PATENT DOCUMENTS

KR    10-2005-0000197 A    1/2005
KR           604465 B1 *    7/2006

OTHER PUBLICATIONS

Jo Das et al., "Improved Thermal Performance of AlGaN/GaN HEMTs by an Optimized Flip-Chip Design", IEEE Transactions on Electron Devices, Nov. 2006, pp. 2696-2702, vol. 53, No. 11.

*Primary Examiner* — Ermias Woldegeorgis
(74) *Attorney, Agent, or Firm* — Rabin & Berdo, P.C.

(57) ABSTRACT

Disclosed are a GaN (gallium nitride) compound power semiconductor device and a manufacturing method thereof. The gallium nitride compound power semiconductor device includes: a gallium nitride compound element formed by being grown on a wafer; a contact pad including a source, a drain, and a gate connecting with the gallium nitride compound element; a module substrate to which the nitride gallium compound element is flip-chip bonded; a bonding pad formed on the module substrate; and a bump formed on the bonding pad of the module substrate so that the contact pad and the bonding pad are flip-chip bonded. By this configuration, it is possible to reduce the process costs by forming the bump on the substrate based on the wafer level, rapidly emit the heat generated from an AlGaN HEMT device by forming the sub source contact pad and the sub drain contact pad of the substrate in the active region, and efficiently emit the heat generated from the AlGaN HEMT device by forming a via hole on the substrate and filling the via hole with the conductive metal.

17 Claims, 3 Drawing Sheets

(51) Int. Cl.
  *H01L 29/417* (2006.01)
  *H01L 29/778* (2006.01)
  *H01L 23/00* (2006.01)
(52) U.S. Cl.
  CPC ...... *H01L29/66462* (2013.01); *H01L 29/7787* (2013.01); *H01L 24/05* (2013.01); *H01L 24/06* (2013.01); *H01L 24/16* (2013.01); *H01L 2224/05554* (2013.01); *H01L 2224/056* (2013.01); *H01L 2224/06135* (2013.01); *H01L 2224/131* (2013.01); *H01L 2224/16227* (2013.01); *H01L 2224/81815* (2013.01); *H01L 2224/05568* (2013.01)

(56) References Cited

U.S. PATENT DOCUMENTS

| | | | |
|---|---|---|---|
| 2004/0130037 A1* | 7/2004 | Mishra et al. | 257/778 |
| 2006/0108602 A1* | 5/2006 | Tanimoto | 257/192 |
| 2006/0120058 A1 | 6/2006 | Fairchild et al. | |
| 2010/0140665 A1* | 6/2010 | Singbal et al. | 257/204 |
| 2010/0230722 A1* | 9/2010 | Chang et al. | 257/194 |

* cited by examiner

WAFER LEVEL PACKAGED GAN POWER SEMICONDUCTOR DEVICE AND THE MANUFACTURING METHOD THEREOF

CROSS-REFERENCE TO RELATED APPLICATIONS

This application is based on and claims priority from Korean Patent Application No. 10-2012-0047360, filed on May 4, 2012, with the Korean Intellectual Property Office, the disclosure of which is incorporated herein in its entirety by reference.

TECHNICAL FIELD

The present disclosure relates to a nitride compound power semiconductor device and a manufacturing method thereof, and more particularly, to a nitride compound power semiconductor device including chip pads having a type that can be flip-chip bonded, in active devices used for a nitride compound power semiconductor so as to increase heat emission efficiency and has a structure capable of efficiently emitting heat generated from drains adjacent to gates that are parts generating the most heat among the active devices, and a method for manufacturing the same.

BACKGROUND

An AlGaN/GaN high electron mobility transistor (HEMT) device, which is a power semiconductor device mainly used in fields that require high output, is bonded by a wire bonding method or a flip-chip method. The GaN (gallium nitride) HEMT device as a power semiconductor device has high output of several W to 100 W or more. For this reason, the GaN HEMT device generates a large amount of heat and therefore, needs to emit heat well. Meanwhile, an RF HEMT needs to have small parasitic inductance.

Therefore, the high-output RF HEMT device is preferably flip-chip bonded due to advantages such as good heat emission characteristics and small parasitic inductance and needs to be designed to have a structure capable of emitting heat well at the time of designing the device. In addition, at the time of manufacturing a module, a substrate on which the HEMT device is mounted needs to be designed and manufactured as a substrate having a material and a structure that emits heat well.

However, a size of an active region in which a source, a drain, and a gate of the HEMT device are formed is as small as about 20 µm and therefore, in order to bond the active region using a bump, the bump formed on a substrate needs to be formed to have a size of 20 µm or less and a via also needs to be formed to have a size of 20 µm or less. In this case, the via may be formed on an LTCC substrate so as to have a size of about 20 µm but it is difficult to fill a via hole of an inner diameter of 20 µm with metals. Therefore, the present disclosure proposes a method for forming a via for solving the above problems.

SUMMARY

The present disclosure has been made in an effort to provide a GaN compound power semiconductor device including contact pads having a structure capable of emitting heat generated from active devices well and a manufacturing method thereof.

The present disclosure has been made in an effort to provide a GaN compound power semiconductor device having positions and structures of pads on a substrate on which active devices are mounted so as to emit heat generated from the active devices well, and a manufacturing method thereof.

The present disclosure has been made in an effort to provide a method for directly flip-chip bonding a bump formed on a substrate to a source and a drain of an active device upon forming the bump at a wafer level and forming a thermal via on a substrate so as to emit heat well through a source bump.

An exemplary embodiment of the present disclosure provides a semiconductor device, including: a gallium nitride compound element formed by being grown on a wafer; a contact pad including a source, a drain, and a gate connecting with the gallium nitride compound element; a module substrate to which the nitride gallium compound element is flip-chip bonded; a bonding pad formed on the module substrate; and a bump formed on the bonding pad of the module substrate so that the contact pad and the bonding pad are flip-chip bonded.

The bonding pad may be disposed so as to have a vertical symmetrical structure or a horizontal symmetrical structure to the contact pad.

The source may be further formed with a sub source contact pad and the drain may be further formed with a sub drain contact pad.

The module substrate may further include a sub source contact bonding pad corresponding to the sub source contact pad and a sub drain contact bonding pad corresponding to the sub drain contact pad.

The bump may be melted at a temperature lower than a process temperature of the gallium nitride compound element.

The module substrate may include a thermal via formed in a jig jag type and a size of the thermal via may be equal to or smaller than a length a+b+c obtained by summing a source horizontal length a, a drain horizontal length b, and a source horizontal length c.

The module substrate may have metals formed on a back side thereof and emit heat by a housing through the thermal via.

Another exemplary embodiment of the present disclosure provides a manufacturing method of a gallium nitride compound power semiconductor device, including: forming a gallium nitride compound element by growing a gallium nitride compound on a wafer to form an element layer; forming a contact pad including a source, a drain, and a gate connecting with the gallium nitride compound element; forming a bonding pad on a module substrate at a position corresponding to the contact pad; and forming a bump on the bonding pad and flip-chip bonding the contact pad and the bonding pad by the formed bump.

In the forming of the bonding pad, the bonding pad may be disposed so as to have a vertical symmetrical structure or a horizontal symmetrical structure to the contact pad.

In the forming of the contact pad, after the source, the drain, and the gate are formed, a sub source contact pad may be formed in the source and a sub drain contact pad may be formed in the drain.

In the forming of the bonding pad, a sub source contact bonding pad may be formed at a position corresponding to the sub source contact pad and a sub drain contact bonding pad may be formed at a position corresponding to the sub drain contact pad.

In the flip-chip bonding, the bump may be melted at a temperature lower than a process temperature of the gallium nitride compound element.

The manufacturing method may further include: after the forming of the bonding pad and prior to the flip-chip bonding, forming a thermal via on the module substrate in a jig jag type, wherein a size of the thermal via may be formed at a length a+b+c obtained by summing a source horizontal length a, a drain horizontal length b, and a source horizontal length c.

In the forming of the thermal via, the module substrate may have metals formed on a back side thereof and emit heat by a housing through the thermal via.

According to the exemplary embodiments of the present disclosure, it is possible to reduce the process costs by forming the bump on the substrate based on the wafer level and reduce the bonding risk as compared with forming the bump in the AlGaN HEMT device.

According to the exemplary embodiments of the present disclosure, it is possible to efficiently emit the heat generated from the AlGaN HEMT device by forming the via hole on the substrate and filling the via hole with the conductive metal.

According to the exemplary embodiments of the present disclosure, it is possible to rapidly emit the heat generated from the AlGaN HEMT device by forming the sub source contact pad and the sub drain contact pad of the substrate in the active region.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
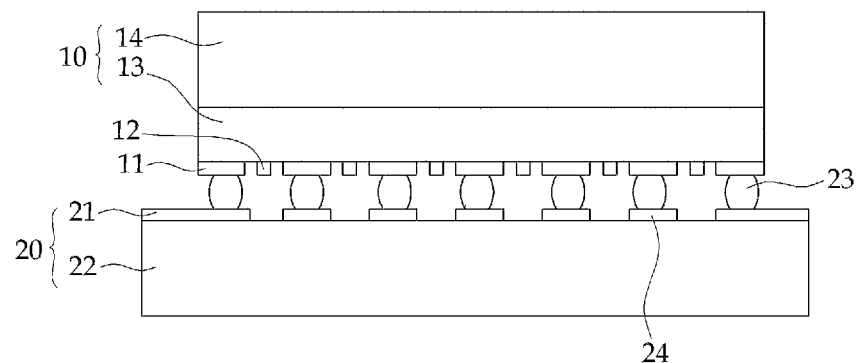
FIG. 1 is a configuration diagram illustrating that an AlGaN/GaN HEMT device according to an exemplary embodiment of the present disclosure is flip-chip bonded on a module substrate.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure relates to a GaN compound power semiconductor device and a manufacturing method thereof and includes chip pads of a type which can be flip-chip bonded in active devices used for the power semiconductor so as to increase heat emission efficiency. In this case, according to the exemplary embodiments of the present disclosure, a structure capable of efficiently emitting heat generated from drains adjacent to gates that are parts generating the most heat in the active device is formed.

Therefore, according to the exemplary embodiment of the present disclosure, a bonding pad is formed so that the active devices may be flip-chip bonded to a module substrate on which the active devices are mounted. Further, a bump is formed on the bonding pad on the module substrate to implement the flip-chip bonding. In this case, the bump is formed at a wafer level.

According to the exemplary embodiment of the present disclosure, a thermal via is formed on the substrate so that the heat generated from the active device is emitted well through the substrate.

Meanwhile, according to the exemplary embodiment of the present disclosure, a plurality of thermal pads are formed on source contact pad edges of the active device, except for drain contact pads and gate pads for ground stability and heat emission.

According to the exemplary embodiment of the present disclosure, drain contact pads may be formed as a single drain contact pad by binding several drain contact portions but include sub contact pads (that is, sub drain contact pads) for each drain contact portion and may be formed as a contact pad (drain contact pad) by connecting drains with each other so as to be bound into a single drain contact pad.

Meanwhile, in the active device according to the exemplary embodiment of the present disclosure capable of implementing the above features, passivation of the contact pad needs to be opened for flip-chip bonding Further, according to the exemplary embodiment of the present disclosure, the substrate needs to be formed of a material that effectively emits heat generated from the active devices through the substrate.

According to the exemplary embodiment of the present disclosure, so as to emit the heat generated from the active device well through the substrate, a thermal via is formed on the substrate and a via is filled with metals by a printing process.

Finally, according to the exemplary embodiment of the present disclosure, the active device is mounted on a front side (front) of the substrate and a backside (rear) of the substrate is thinly deposited with metals such as Au so as to be in direct contact with a module surface, thereby emitting heat well.

Hereinafter, exemplary embodiments of the present disclosure will be described in more detail with reference to the accompanying drawings. A configuration and an acting effect of exemplary embodiments of the present disclosure will be clearly understood through the following detailed description. Prior to the detailed description of the present disclosure, it should be noted that like reference numerals refer to like elements even though like elements are shown in different drawings and well-known functions or constructions will not be described in detail since they may unnecessarily obscure the understanding of the present disclosure.

FIG. 1 is a configuration diagram illustrating that an AlGaN/GaN HEMT device according to an exemplary embodiment of the present disclosure is flip-chip bonded to a module substrate.

Referring to FIG. 1, an AlGaN/GaN HEMT device 10 according to an exemplary embodiment of the present disclosure includes an AlGaN/GaN layer 13 that is grown on a wafer 14. The wafer 14 is made of silicon carbide (SiC), sapphire, silicon (Si), and the like.

Contact pads 11 and 12 are formed on the AlGaN/GaN layer 13. A source or drain contact pad 11 connects a signal line with an ohmic-contact between the source and the drain and the gate contact pad 12 connects the signal line with a gate-ohmic contact.

Meanwhile, a substrate 20 for modularization is made of alumina $Al_2O_3$, MN, and the like, a top surface of the substrate 20 is provided with a signal line 21, a bump 23, and a bonding pad 24. The AlGaN/GaN HEMT device 10 is mounted on the substrate 20 through the bump 23.

The bump 23 may be made of metal materials having components similar to those of metal materials forming the contact pad 11 and the bonding pad 24 of the substrate 20 for flip-chip bonding.

The HEMT device 10 and the substrate 20 each need to be heated to temperature at which the bump 23 is melted so that the AlGaN/GaN HEMT device 10 is flipped to be bonded to the substrate 20. In order to prevent the AlGaN/GaN HEMT device 10 from being damaged due to the heating, the bum 23 is made of materials having a melting point lower than a process temperature of the AlGaN/GaN HEMT device 10.

Figure 2:
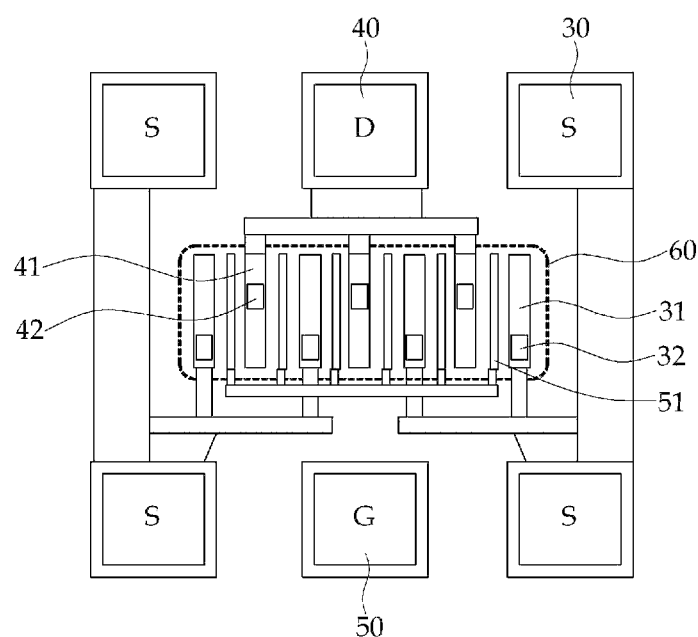
FIG. 2 is a configuration diagram illustrating a bonding pad of the AlGaN/GaN HEMT device according to the exemplary embodiment of the present disclosure.

FIG. 2 is a configuration diagram illustrating the AlGaN/GaN HEMT device according to the exemplary embodiment of the present disclosure.

In the HEMT device 10 of FIG. 2, an area in which a source 31, a drain 41, and a gate 51 are formed is represented by an active region 60, the source contact pad 30 of the source 31 is represented by S, the drain contact pad 40 of the drain 41 is represented by D, and the gate contact pad 50 of the gate 51 is represented by G.

When the HEMT device 10 is mounted on the substrate 20, the contact pads 30, 40, and 50 for each of the source 31, the drain 41, and the gate 51 of the HEMT device 10 are bonded to source, drain, and gate contact bonding pads 90, 70, and 80 of the substrate 20 in a vertical symmetrical structure or a horizontal symmetrical structure. Therefore, the source contact pad 30, the drain contact pad 40, the gate contact pad 50 of the HEMT device 10 need to be designed to have a symmetrical structure to the source contact bonding pad 90, the drain contact bonding pad 70, and the gate contact bonding pad 80 of the substrate 20.

In order to flip-chip bond the HEMT device 10 according to the exemplary embodiment of the present disclosure, a sub source contact pad 32 and a sub drain contact pad 42 are opened in the source 31 and the drain 41 of the active region 60, in addition to the source contact pad 30, the drain contact pad 40, the gate contact pad 50, when the bonding pad of the passivated HEMT device is opened.

The shape and size of the sub source contact pad 32 and the sub drain contact pad 42 needs to be opened smaller than the size of the source 31 and the drain 41, according to the shape and size of the bump to be formed in the sub source contact bonding pad 91 and the sub drain contact bonding pad 71 of the substrate.

Figure 3:
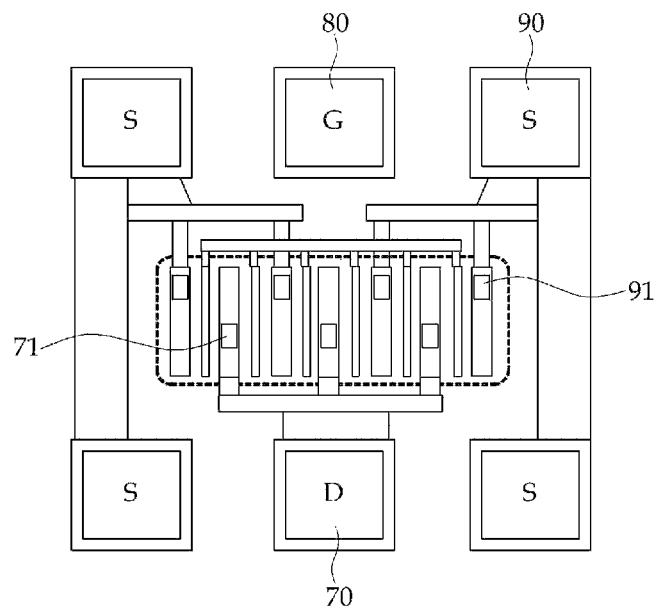
FIG. 3 is a configuration diagram illustrating a bonding pad on a module substrate for flip-chip bonding according to the exemplary embodiment of the present disclosure.

FIG. 3 is a configuration diagram illustrating a module substrate and a bump for flip-chip bonding the HEMT device according to an exemplary embodiment of the present disclosure.

In FIG. 3, the source contact bonding pad 90, the drain contact bonding pad 70, and the gate contact bonding pad 80 of the module substrate 20 have a vertical symmetrical structure to the source contact pad 30, the drain contact pad 40, and the gate contact pad 50 of the HEMT device 10.

The sub source contact bonding pad 91 and the sub drain contact bonding pad 71 of the substrate 20 are formed so as to correspond to the shapes and sizes of the sub source contact pad 32 and the sub drain contact pad 42 of the HEMT device 10, respectively. In this case, the bump 23 to be formed for flip-chip bonding uses metal materials having components similar to those of metal materials forming the pad 11 of the HEMT device and the pad 21 of the substrate.

Generally, an ohmic-contact metal between the source 31 and the drain 41 of the active region 60 in the AlGaN/GaN HEMT device 10 includes Au and the source contact pad 30, the drain contact pad 40, and the gate contact pad 50 also include Au. Therefore, the source contact bonding pad 90, the drain contact bonding pad 70, and the gate contact bonding pad 80 and the sub source contact bonding pad 91 and the sub drain contact bonding pad 71 of the substrate 20 may include Au.

Since the process temperature of the HEMT device 10 is about 300° C., materials such as SnAu melted at about 250° C. lower than 300° C. that is a temperature of the HEMT device 10 so as to prevent the HEMT device 10 from being damaged at the time of bonding are deposited by e-beam evaporation to form the bump 23.

According to another exemplary embodiment of the present disclosure, the source contact bonding pad 90, the drain contact bonding pad 70, and the gate contact bonding pad 80 of the substrate 20 may have a horizontal symmetrical structure to the source contact pad 30, the drain contact pad 40, and the gate contact pad 50 of the HEMT device 10.

Figure 4A:
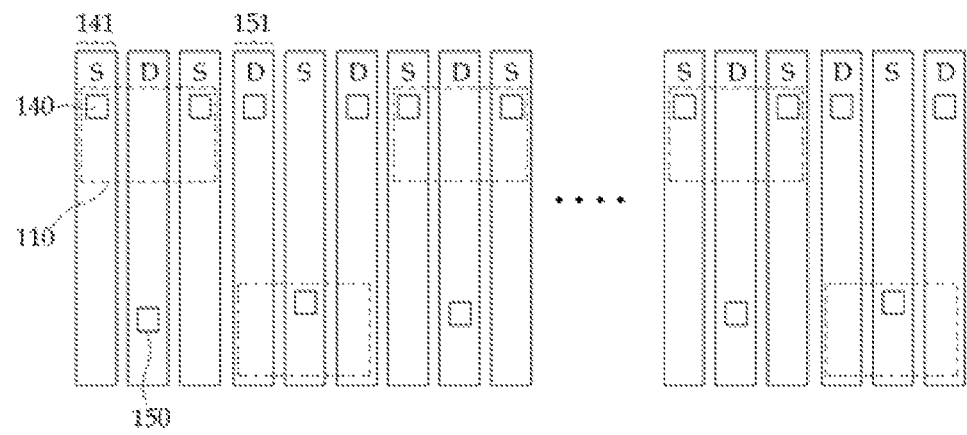
FIG. 4A and FIG. 4B are configuration diagram illustrating that a thermal via and a backside metal are formed on the module substrate according to the exemplary embodiment of the present disclosure.
Figure 4B:
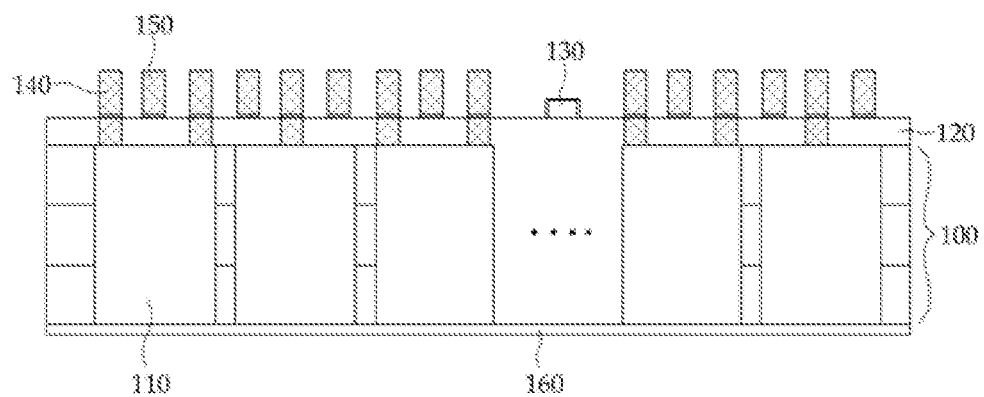

FIG. 4A and FIG. 4B are configuration diagram illustrating that a thermal via and a backside metal are formed on the module substrate according to the exemplary embodiment of the present disclosure, wherein FIG. 4A is a plan view and FIG. 4B is a cross-sectional view.

A source contact bonding pad 140 bonded to the source contact pad 30 of the HEMT device 10 on a module substrate 100 has a thermal via 110 penetrating through the substrate formed therebeneath so as to be connected with a backside metal 160 on the rear of the substrate.

The source contact bonding pad 90 is bonded to the source contact pad 30 of the HEMT device 10 and the signals transferred to the drain 41 and the gate 51 of the HEMT device 10 are applied through a trace 130 on the substrate. A bonding pad 150 on the substrate represents a sub drain contact bonding bump 150 of the substrate that is bonded to the sub drain contact pad 42 of the HEMT device. Further, the bonding pad 140 on the substrate represents the sub source contact bonding bump 140 of the substrate that is bonded to the sub source contact pad 32 of the HEMT device. The rear of the substrate is covered with a backside metal 160 to contact a metal housing module to rapidly emit heat generated from the HEMT device 10 and expand a ground surface of the device, thereby reducing noise.

It is difficult to form the thermal via 110 on the substrate or fill the thermal via since a horizontal length of the source 141 of the HEMT device is as very small as about 20 μm Therefore, the thermal via 110 on the substrate is formed to have a size equal to or smaller than a length a+b+c obtained by summing a source horizontal length a 141, a drain horizontal length b 151, and a source horizontal length c 141, and a plurality of the thermal vias 110 may be disposed in a zig-zag as illustrated in FIG. 4A. As illustrated in FIGS. 4A-4B, in some embodiments, the thermal via 110 partially extends across each of a first of the sources, a first of the drains, and a second of the sources. As illustrated in FIGS. 4A-4B, in some embodiments, the thermal via 110 at least partially extends across each of a first of the drains, a first of the sources, and a second of the drains. As illustrated in FIGS. 4A-4B, in some embodiments, some of the thermal vias 110 at least partially extend across each of a first of the drains, a first of the sources, and a second of the drains; and others of the thermal vias 110 may at least partially extend across each of a second of the sources, a third of the drains, and a third of the sources. As illustrated, a thermal via 110 at least partially extending across a source (or drain) may include embodiments where the thermal via 110 does not necessarily extend entirely from one side of a source (or drain) to the other side of the source (or drain). Instead, the thermal via 110 may extend for only part of the source (or drain). However, as illustrated, partially extend may also include embodiments where the thermal via 110 extends entirely from one side of a source (or drain) to the other side of the source (or drain).

Next, a via hole is filled with metals having excellent thermal conductivity such as silver (Ag) by printing.

Next, the backside metal 160 of the substrate forms a copper film of about 5 μm by a printing method.

The sub source bonding bump 140, the sub drain bonding bump 150, and the trace 130 of the substrate are formed by a thin film process using a chromium mask.

In the thin film process, the sub source contact bonding pad 140 is opened by applying photoresist on the front side of the substrate and exposing and developing the photoresist using a mask. Thereafter, Ti/Ni/Au seed metal is thinly deposited and Sn/Ag is plated and then, the photoresist and the Ti/Ni/Au seed metal are removed by a lift-off process.

Next, a BCB is applied to the front side of the substrate as high as Sn/Ag and is then hardened. Next, the Ti/Au seed metal is deposited on the front side of the substrate, the photoresist is applied and is subjected to the exposing and developing processes to open an area of the signal line trace 130, and the signal line trace 130 is formed by a plating process and the photoresist is removed.

Next, the photosensitive BCB is applied to the front side of the substrate and then, the photoresist is applied and the sub drain contact bonding area 150 and the sub source bonding area 140 are opened by the exposing and developing processes, and the sub drain contact bonding bump 150 and the sub source contact bonding bump 140 are formed by plating the Sn/Ag. Next, the photoresist is removed and the Ti/Au seed metal is removed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A power semiconductor device, comprising:
   a gallium nitride compound element;
   a contact pad including sources, a drain, and a gate connecting with the gallium nitride compound element;
   a module substrate to which the gallium nitride compound element is flip-chip bonded;
   a bonding pad formed on the module substrate;
   a bump formed on the bonding pad of the module substrate so that the contact pad and the bonding pad are flip-chip bonded; and
   thermal vias disposed in the module substrate, the thermal vias being formed so as to at least partially extend across each of the sources and the drain to emit heat from the gallium nitride compound element, the thermal vias being disposed relative to each other so as to form a zig-zag, and a size of each of the thermal vias is equal to or smaller than a length calculated by a formula a+b+c, wherein
   a in the formula is a source horizontal length of one of the sources,
   b in the formula is a drain horizontal length of the drain, and
   c in the formula is a source horizontal length of another of the sources.

2. The power semiconductor device of claim 1, wherein each of the sources is further formed with a sub source contact pad, and the drain is further formed with a sub drain contact pad.

3. The power semiconductor device of claim 2, wherein the module substrate further includes
   sub source contact bonding pads corresponding to the sub source contact pads, and
   a sub drain contact bonding pad corresponding to the sub drain contact pad.

4. The power semiconductor device of claim 3, wherein one of the thermal vias extends completely across both one of the sub source contact bonding pads and the sub drain contact bonding pad.

5. The power semiconductor device of claim 1, wherein the bonding pad is disposed so as to have a vertical symmetrical structure or a horizontal symmetrical structure to the contact pad.

6. The power semiconductor device of claim 1, wherein the bump is melted at a temperature lower than a process temperature of the gallium nitride compound element.

7. The power semiconductor device of claim 1, wherein the module substrate has a metal formed on a back side thereof, the module substrate emitting heat through the thermal vias to a housing.

8. The power semiconductor device of claim 1, wherein one of thermal vias is the only thermal via that partially extends across each of the one of the sources and the drain.

9. A manufacturing method of a gallium nitride compound power semiconductor device, comprising:
   forming a gallium nitride compound element;
   forming a contact pad including sources, drains, and a gate to be connected with the gallium nitride compound element;
   forming a bonding pad on a module substrate at a position corresponding to the contact pad;
   forming a bump on the bonding pad and flip-chip bonding the contact pad and the bonding pad by the formed bump; and
   forming thermal vias in the module substrate, the thermal vias being formed so as to at least partially extend across each of the sources and the drains to emit heat from the gallium nitride compound element, a single first of the thermal vias being formed so as to at least partially extend across each of two of the sources and one of the drains to emit heat from the gallium nitride compound element, and a single second of the thermal vias being formed so as to at least partially extend across each of another of the sources and two others of the drains to emit heat from the gallium nitride compound element.

10. The manufacturing method of claim 9, wherein in the forming of the contact pad, after the sources, the drains, and the gate are formed, sub source contact pads are formed in the sources and sub drain contact pads are formed in the drains.

11. The manufacturing method of claim 10, wherein in the forming of the bonding pad, sub source contact bonding pads are formed at positions corresponding to the sub source contact pads and sub drain contact bonding pads are formed at positions corresponding to the sub drain contact pads.

12. The manufacturing method of claim 11, wherein
   forming thermal vias on the module substrate occurs after the forming of the bonding pad and prior to the flip-chip bonding, the thermal vias being disposed relative to each other to form a zig-zag,
   wherein a size of each of the thermal vias is formed at a length equal to or smaller than a length calculated by a formula a+b+c, wherein
   a in the formula is a source horizontal length of a first of the sources, b in the formula is a drain horizontal length of a first of the drains, and c in the formula is a source horizontal length of a second of the sources.

13. The manufacturing method of claim 12, further comprising:

forming a metal at a back side of the module substrate; and emitting heat through the thermal vias to a housing.

14. The manufacturing method of claim 11, wherein one of the thermal vias extends completely across both one of the sub source contact bonding pads and one of the sub drain contact bonding pads.

15. The manufacturing method of claim 9, wherein in the forming of the bonding pad, the bonding pad is disposed so as to have a vertical symmetrical structure or a horizontal symmetrical structure to the contact pad.

16. The manufacturing method of claim 9, wherein in the flip-chip bonding, the bump is melted at a temperature lower than a process temperature of the gallium nitride compound element.

17. A power semiconductor device, comprising:

a gallium nitride compound element;

a contact pad including sources, drains, and a gate connecting with the gallium nitride compound element;

a module substrate to which the gallium nitride compound element is flip-chip bonded;

a bonding pad formed on the module substrate;

a bump formed on the bonding pad of the module substrate so that the contact pad and the bonding pad are flip-chip bonded; and thermal vias on the module substrate, the thermal vias being formed so as to at least partially extend across the sources and the drains, a single first of the thermal vias being formed so as to at least partially extend across each of two of the sources and one of the drains to emit heat from the gallium nitride compound element, and a single second of the thermal vias being formed so as to at least partially extend across each of another of the sources and two others of the drains to emit heat from the gallium nitride compound element.

* * * * *